US012424552B2

(12) United States Patent
Wang et al.

(10) Patent No.: US 12,424,552 B2
(45) Date of Patent: Sep. 23, 2025

(54) SEMICONDUCTOR STRUCTURE AND METHOD OF MANUFACTURING THEREOF

(71) Applicant: NANYA TECHNOLOGY CORPORATION, New Taipei (TW)

(72) Inventors: Chun-Wei Wang, Keelung (TW); Jen-I Lai, Taoyuan (TW); Rou-Wei Wang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 746 days.

(21) Appl. No.: 17/448,708

(22) Filed: Sep. 24, 2021

(65) Prior Publication Data

US 2023/0095867 A1     Mar. 30, 2023

(51) Int. Cl.
*H01L 23/532*     (2006.01)
*H01L 21/311*     (2006.01)
(Continued)

(52) U.S. Cl.
CPC .. *H01L 23/53238* (2013.01); *H01L 21/31111* (2013.01); *H01L 21/76802* (2013.01);
(Continued)

(58) Field of Classification Search
CPC ......... H01L 23/53238; H01L 21/31111; H01L 21/76802; H01L 21/76829;
(Continued)

(56) References Cited

U.S. PATENT DOCUMENTS 4,714,517 A * 12/1987 Malladi ................... C23C 22/52
134/28
7,021,320 B2  4/2006 Lee et al.
(Continued)

FOREIGN PATENT DOCUMENTS

CN     106030792 A    10/2016
TW     202033779 A     9/2020

OTHER PUBLICATIONS

Sigma-Aldrich product catalogue No. 818707 (Citric Acid), retrieved from Internet Archive Wayback Machine (web capture from Nov. 19, 2019), https://web.archive.org/web/20191119143841/https://www.emdmillipore.com/US/en/product/Citric-acid,MDA_CHEM-818707 (Year: 2019).*

*Primary Examiner* — Erik T. K. Peterson
(74) *Attorney, Agent, or Firm* — CKC & Partners Co., LLC

(57) ABSTRACT

A method of manufacturing a semiconductor structure includes a number of operations. A first oxide layer is provided on a semiconductor integrated circuit. A conductive layer of the semiconductor integrated circuit is exposed from a top surface of the first oxide layer. An etch stop layer is formed on the top surface of the first oxide layer. A second oxide layer is formed on the etch stop layer. A through via is formed extending through the second oxide layer and the etch stop layer to expose the conductive layer. Acid is provided on the conductive layer to form a protective layer on the conductive layer. The protective layer includes a compound of the acid and material of the conductive layer. A fence of the second oxide layer at an edge on the through via is removed at the through via by a hydrofluoric acid etching.

10 Claims, 9 Drawing Sheets

(51) Int. Cl.
  *H01L 21/768* (2006.01)
  *H01L 23/522* (2006.01)
(52) U.S. Cl.
  CPC .. *H01L 21/76829* (2013.01); *H01L 21/76877* (2013.01); *H01L 23/5226* (2013.01)
(58) Field of Classification Search
  CPC ........... H01L 21/76877; H01L 23/5226; H01L 21/31144; H01L 21/76805; H01L 21/76807; H01L 21/76814; H01L 2221/1015
  See application file for complete search history.

(56) References Cited

U.S. PATENT DOCUMENTS

| | | | |
|---|---|---|---|
| 2001/0012684 A1* | 8/2001 | Hattori | H01L 21/76808 438/618 |
| 2003/0157806 A1* | 8/2003 | Nagahara | H01L 21/0274 257/E21.259 |
| 2004/0200803 A1* | 10/2004 | Lee | H01L 21/76808 257/E21.252 |
| 2014/0353795 A1* | 12/2014 | Tong | H01L 21/02255 438/424 |

* cited by examiner

SEMICONDUCTOR STRUCTURE AND METHOD OF MANUFACTURING THEREOF

BACKGROUND

Field of Invention

The present disclosure relates to a semiconductor structure and a method of manufacturing a semiconductor structure.

Description of Related Art

In a via-first sequence for a conductive interconnector, a fence surrounding a formed through via may be unexpectedly formed. The fence will cause poor deposition of conductive material such that the overall electrical properties of the formed structure are reduced.

Therefore, those in the industry are endeavoring to provide a solution for limiting a reduction in electrical properties caused by the formation of a fence.

SUMMARY

One aspect of the present disclosure is related to a method of manufacturing a semiconductor structure.

According to one embodiment of the present disclosure, a method of manufacturing a semiconductor structure includes a number of operations. A first oxide layer is provided on a semiconductor integrated circuit. A conductive layer of the semiconductor integrated circuit is exposed from a top surface of the first oxide layer. An etch stop layer is formed on the top surface of the first oxide layer. A second oxide layer is formed on the etch stop layer. A through via is formed and extended through the second oxide layer and the etch stop layer to expose the conductive layer and form a fence that is a portion of the second oxide layer and protrudes from an edge of the through via. A fluid of an acid is provided on the conductive layer to form a protective layer on a top surface of the conductive layer. The protective layer includes a compound of the acid and a material of the conductive layer. A fence is removed by a wet etching. The protective layer has a greater resistance against the wet etching than the fence.

In one or more embodiments of the present disclosure, the acid is citric acid.

In some embodiments, the fluid of the citric acid has a pH value in a range between two and four.

In one or more embodiments of the present disclosure, the material of the conductive layer is copper.

In one or more embodiments of the present disclosure, the wet etching is a hydrofluoric acid etching.

In one or more embodiments of the present disclosure, the method further includes a number of operations. A trench is formed and recessed from a top of the second oxide layer. The trench is aligned with the through via, and a width of the trench is greater than a width of the through via. The fence is located at a bottom of the trench and surrounds the through via to form a ring.

In some embodiments, the width of the trench is increased to a determined critical dimension after the fence is removed by the hydrofluoric acid etching.

In some embodiments, forming the trench from the top of the second oxide layer further includes a number of operations. A photo-resist layer is formed on the top of the second oxide layer. The photo-resist layer has an opening corresponding to the width of the trench. An anti-reflective coating is filled in the through via. The second oxide layer is etched according to the opening of the photo-resist layer to form the trench.

In some embodiments, the anti-reflective coating filled in the through via is located on the etch stop layer. Forming a through via extending through the second oxide layer and the etch stop layer to the conductive layer further includes a number of operations. The anti-reflective coating filled in the through via is removed. The through via is extended within the second oxide layer through the etch stop layer to the conductive layer.

In one or more embodiments of the present disclosure, the method further includes a number of operations. A conductive material is filled in the through via.

One aspect of the present disclosure is related to a semiconductor structure.

According to one embodiment of the present disclosure, a semiconductor structure includes a semiconductor integrated circuit, a first oxide layer, an etch stop layer, a second oxide layer, a through via and a protective layer. The semiconductor integrated circuit has a conductive layer exposed from a top surface of the first oxide layer. The first oxide layer is located on the semiconductor integrated circuit. The etch stop layer is located on a top surface of the first oxide layer and covers the conductive layer. The second oxide layer is located on the etch stop layer. The through via extends through the second oxide layer and the etch stop layer to the conductive layer. The through via is filled with a conductive material. The protective layer is located between the conductive layer and the conductive material. The protective layer is located at a bottom of the conductive material. The protective layer includes a compound of the acid and a material of the conductive layer. The protective layer has an ability to resist hydrofluoric acid etching.

In one or more embodiments of the present disclosure, the material of the conductive layer includes copper.

In one or more embodiments of the present disclosure, the acid includes citric acid.

In some embodiments, the citric acid has a pH value in a range between two and four.

In one or more embodiments of the present disclosure, the semiconductor structure further includes a trench. The trench is recessed from a top of the second oxide layer. The trench is aligned with the through via. A width of the trench is greater than a width of the through via. The through via is located within the trench.

In summary, the formed semiconductor structure can have a protective layer, which includes a compound of the acid and metal and has the ability to resist hydrofluoric acid etching. Therefore, after etching, the fence affecting the overall electrical properties can be removed, and the conductive layer of the semiconductor integrated circuit can be left remaining.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1:
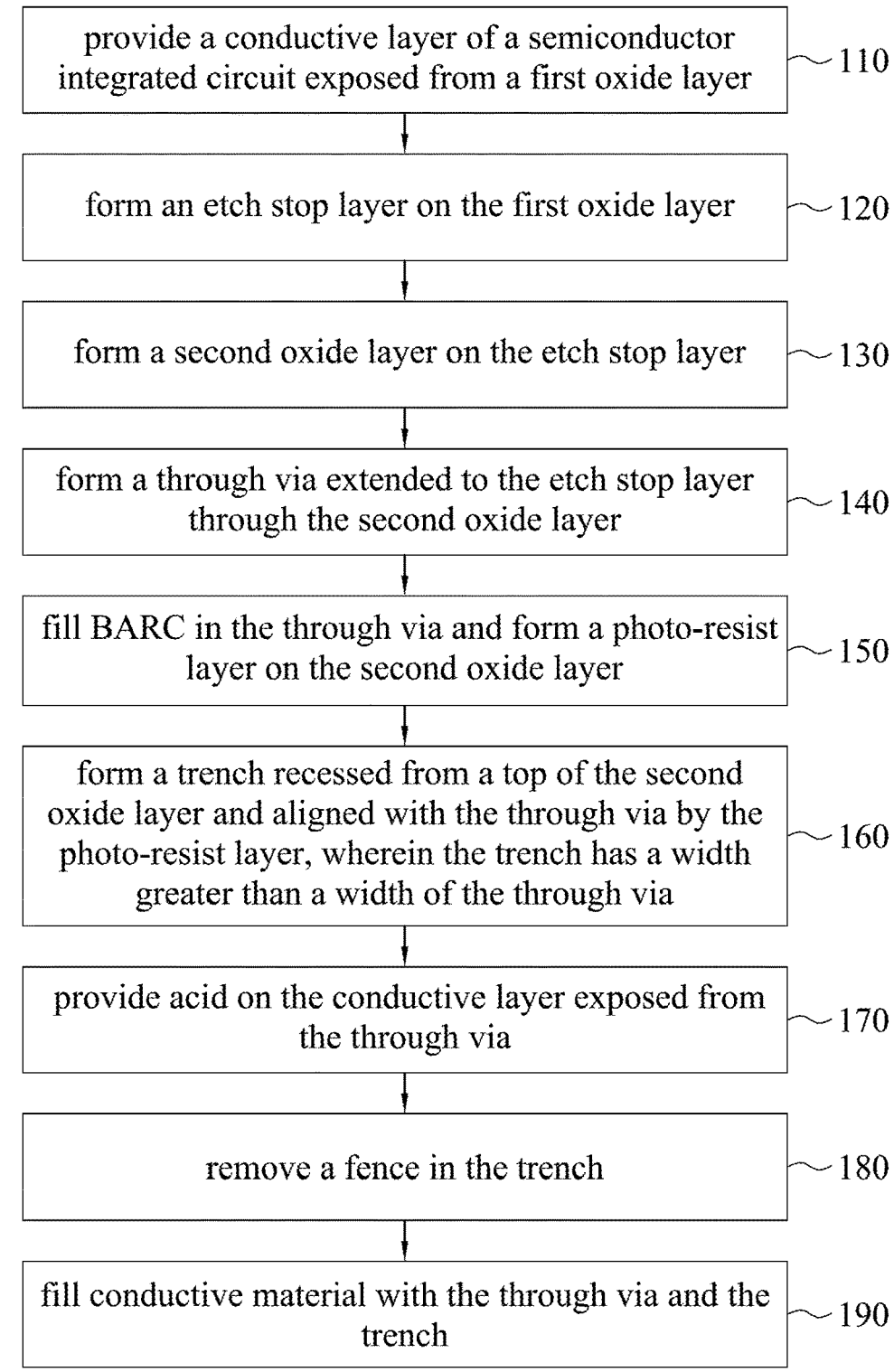
FIG. 1 illustrates a flow chart of a method of manufacturing a semiconductor structure according to one embodiment of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as used in the field and in the context of the disclosure unless particularly specified otherwise. Some terms used to describe the disclosure are to be discussed below or elsewhere in the specification to provide additional guidance related to the description of the disclosure to those in the art.

Phrases "first," "second," etc., are solely used to separate the descriptions of elements or operations with the same technical terms, and are not intended to impart meaning related to order or to otherwise limit the disclosure.

Secondly, "comprising," "includes," "provided," and the like are all open-ended terms, i.e., they mean including but not limited to.

Further, in the context, "a" and "the" generally refer to one or more elements unless the context particularly requires otherwise. It will be further understood that the terms "comprising," "includes," "provided," and the like indicate the characterization, region, integer, step, operation, element and/or component stated, and do not exclude stated descriptions or additional one or more other characterizations, regions, integers, steps, operations, elements, components and/or groups thereof.

Reference is made by FIG. 1. FIG. 1 illustrates a flow chart of a method 100 of manufacturing a semiconductor structure according to one embodiment of the present disclosure. Additional reference is made to FIGS. 2-9. FIGS. 2-9 illustrate schematic cross-sectional views during the method 100 of manufacturing a semiconductor structure according to one embodiment of the present disclosure.

Figure 2:
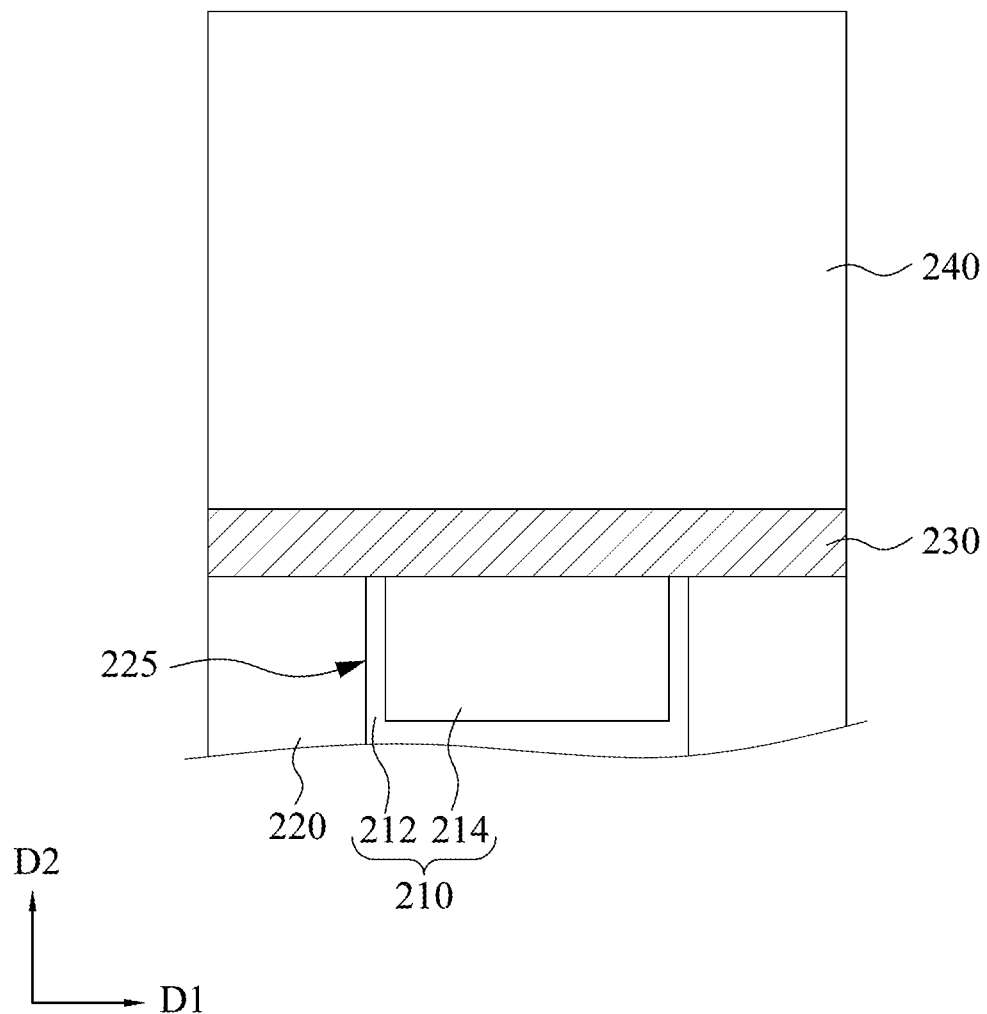
FIGS. 2-9 illustrate schematic cross-sectional views during a method of manufacturing a semiconductor structure according to one embodiment of the present disclosure.

Reference is made first to FIGS. 1 and 2. In operation 110, a semiconductor integrated circuit 210 is provided. As shown in FIG. 2, the semiconductor integrated circuit 210 includes a seed layer 212 and a conductive layer 214, and the seed layer 212 and the conductive layer 214 are connected to other electrical elements of the semiconductor integrated circuit 210, as will be described below. In some embodiments, the semiconductor integrated circuit 210 includes memories and/or a chip. For the purpose of simple description, the electrical elements connected to and below the seed layer 212 and the conductive layer 214 are not shown in the drawings.

In FIG. 2, a first oxide layer 220 is formed on the semiconductor integrated circuit 210, and the conductive layer 214 of the semiconductor integrated circuit 210 is provided in an opening 225 of the first oxide layer 220. In some embodiments, the first oxide layer 220 is used as a dielectric layer, and the conductive layer 214 extends through the first oxide layer 220 and is used as an electrical interconnector, which can connect other electrical elements of the semiconductor integrated circuit 210 to other structures.

As shown in FIG. 2, the seed layer 212 and the conductive layer 214 of the semiconductor integrated circuit 210 are located in the opening 225 of the first oxide layer 220.

In some embodiments, the first oxide layer 220 can be formed on the semiconductor integrated circuit 210 before the seed layer 212 and the conductive layer 214 are formed. Next, the opening 225 is formed through the first oxide layer 220 and aligned with one of the electrical elements (e.g. memories or a chip), which is below the first oxide layer 220, of the semiconductor integrated circuit 210. After the opening 225 is formed, the seed layer 212 of the semiconductor integrated circuit 210 can be deposited in the opening 225, and then the conductive layer 214 of the semiconductor integrated circuit 210 can be filled in the opening 225 through the seed layer 212.

In some embodiments, a material of the conductive layer 214 includes metal. In this embodiment, the material of the conductive layer 214 includes copper.

After operation 110 is performed, the conductive layer 214 of the semiconductor integrated circuit 210 is exposed from the first oxide layer 220. As shown in FIG. 2, tops of the exposed seed layer 212, the exposed conductive layer 214 and the first oxide layer 220 are coplanar with each other to form a surface extended along a first direction D1. In some embodiments, the coplanar tops of the exposed seed layer 212, the exposed conductive layer 214 and the first oxide layer 220 can be provided through a flattening process after the conductive layer 214 of the semiconductor integrated circuit 210 is formed.

Referring to FIG. 1, the method proceeds to operation 120. In operation 120, with reference also to FIG. 2, an etch stop layer 230 is formed on the first oxide layer 220. The exposed conductive layer 214 of the semiconductor integrated circuit 210 is covered by the etch stop layer 230. In some embodiments, for a via-first semiconductor sequence, the etch stop layer 230 can be used to protect the conductive layer 214 of the semiconductor integrated circuit 210 from being damaged during etching.

Referring to FIG. 1, the method proceeds to operation 130. In operation 130, with reference also to FIG. 2, a second oxide layer 240 is formed on the etch stop layer 230. In some embodiments, the second oxide layer 240 can also be used as a dielectric layer.

Next, in operation 140, a through via 250 (see FIG. 4) extended through the second oxide layer 240 to the etch stop layer 230 is formed.

Figure 3:
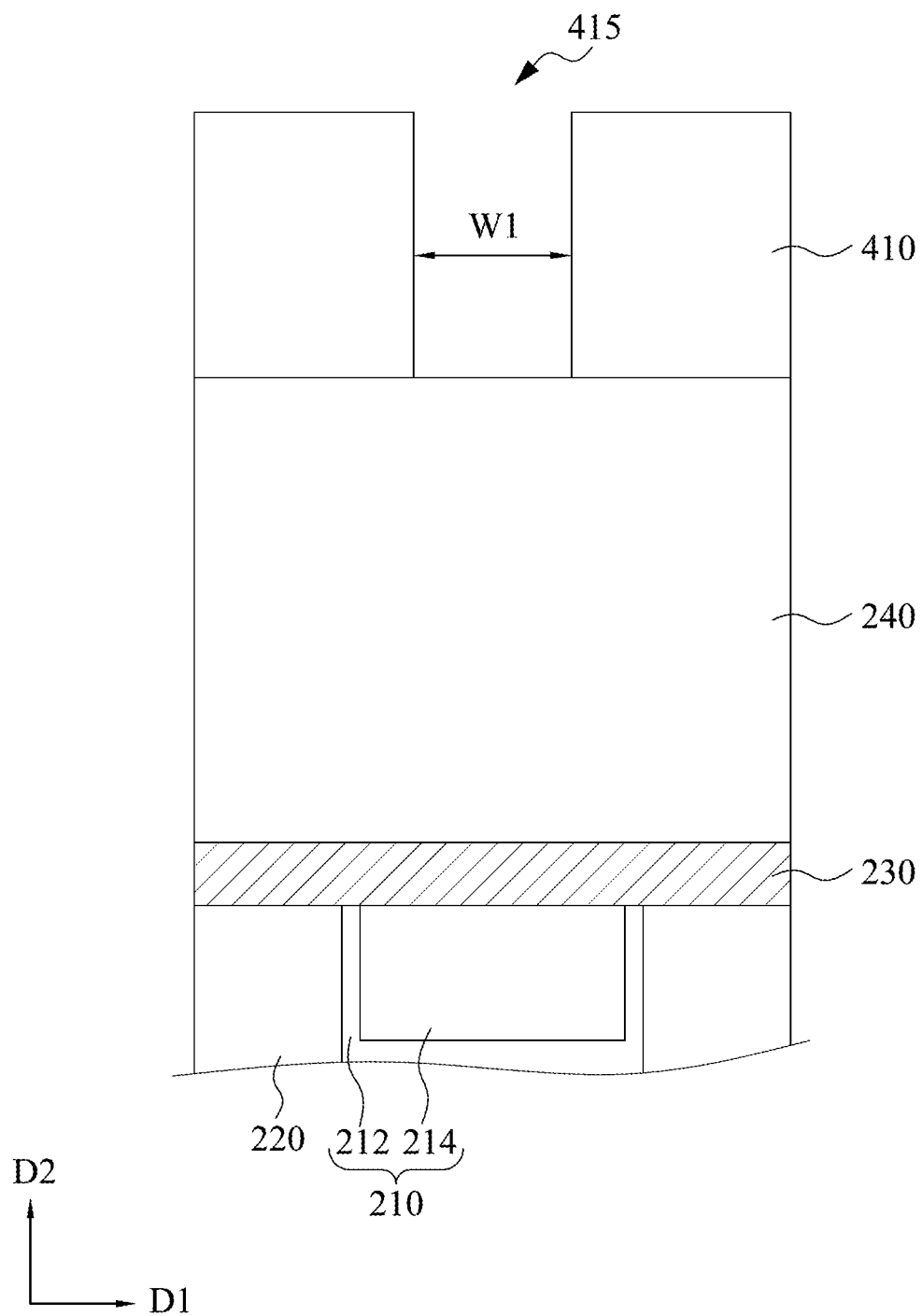
Figure 4:
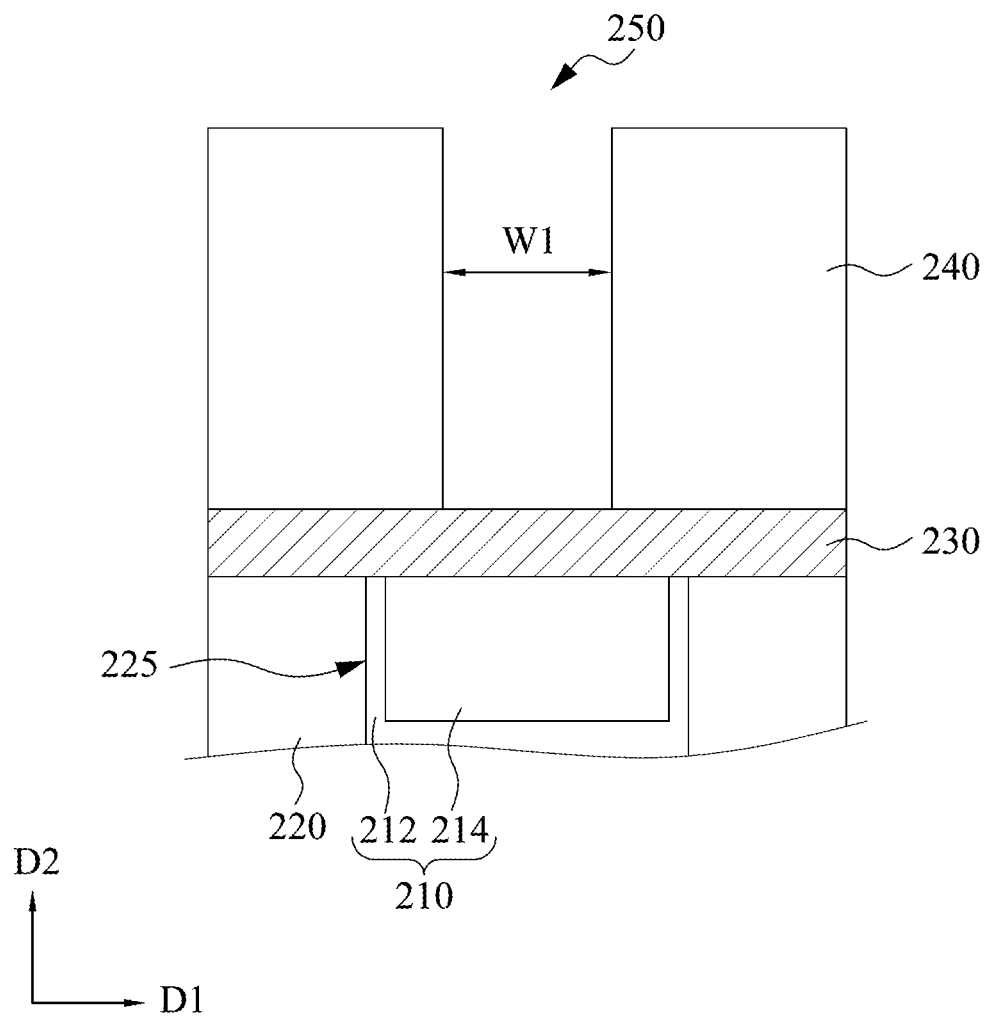

FIGS. 3 and 4 illustrate cross-sectional views of example operations for forming the through via 250. It should be noted that the example shown in FIGS. 3 and 4 is not intended to limit the present disclosure.

As shown in FIG. 3, a masking layer 410 is formed on the second oxide layer 240. After being patterned, the masking layer 410 has an opening 415 aligned with the conductive layer 214 of the semiconductor integrated circuit 210. The opening 415 has a width W1 extended along the first direction D1.

After the masking layer 410 with the opening 415 is formed on the second oxide layer 240, the second oxide layer 240 is etched by an anisotropic etching process according the masking layer 410, and the through via 250 extending to the etch stop layer 230 is formed. As shown in FIG. 4, in this embodiment, the through via 250 extends along a second direction D2 perpendicular to the first direction D1, and the through via 250 has a width W1 extended along the first direction D1 based on the opening 415 of the masking layer 410. The etch stop layer 230 is used to protect the conductive layer 214 and the first oxide layer 220 under the second oxide layer 240. In some embodiments, a material of the etch stop layer 230 includes nitride. In some embodiments, the etch stop layer 230 includes SiN, SiCN or a block SiN—SiCN—SiN compound.

Figure 5:
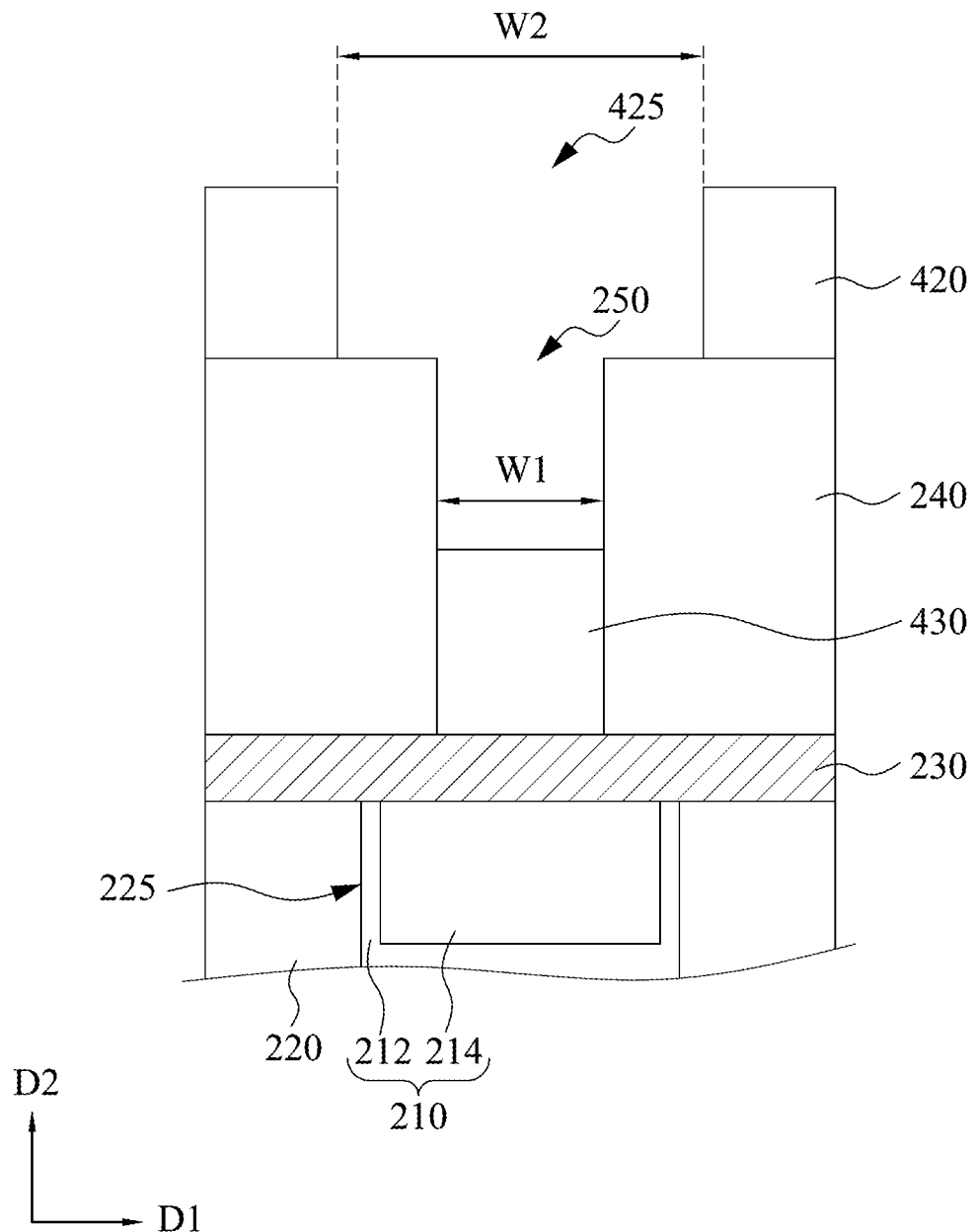

Reference is now made to both FIG. 1 and FIG. 5. In operation 150, a bottom anti-reflective coating (BARC) 430 is filled in the through via 250, and a photo-resist layer 420 is formed on the second oxide layer 240. The formed photo-resist layer 420 is patterned to have an opening 425 aligned with the through via 250 and the conductive layer 214 of the semiconductor integrated circuit 210. As shown in FIG. 5, the opening 425 has a width W2 along the second direction D2.

The photo-resist layer 420 is used for photolithography of the second oxide layer 240. To avoid damaging the through via 250, the BARC 430 is formed within the through via 250, and the reflection from light of photolithography within the through via 250 can be avoided. In some embodiments, the BARC 430 is formed within the through via 250 through a depositing process, and the BARC 430 is used to protect the through via 250 from etching of the light of photolithography by resisting reflection of the light of photolithography. In this embodiment, material of the BARC 430 is also a photo-resist material, which can be etched by the light used for photolithography of the photo-resist layer 420.

Figure 6:
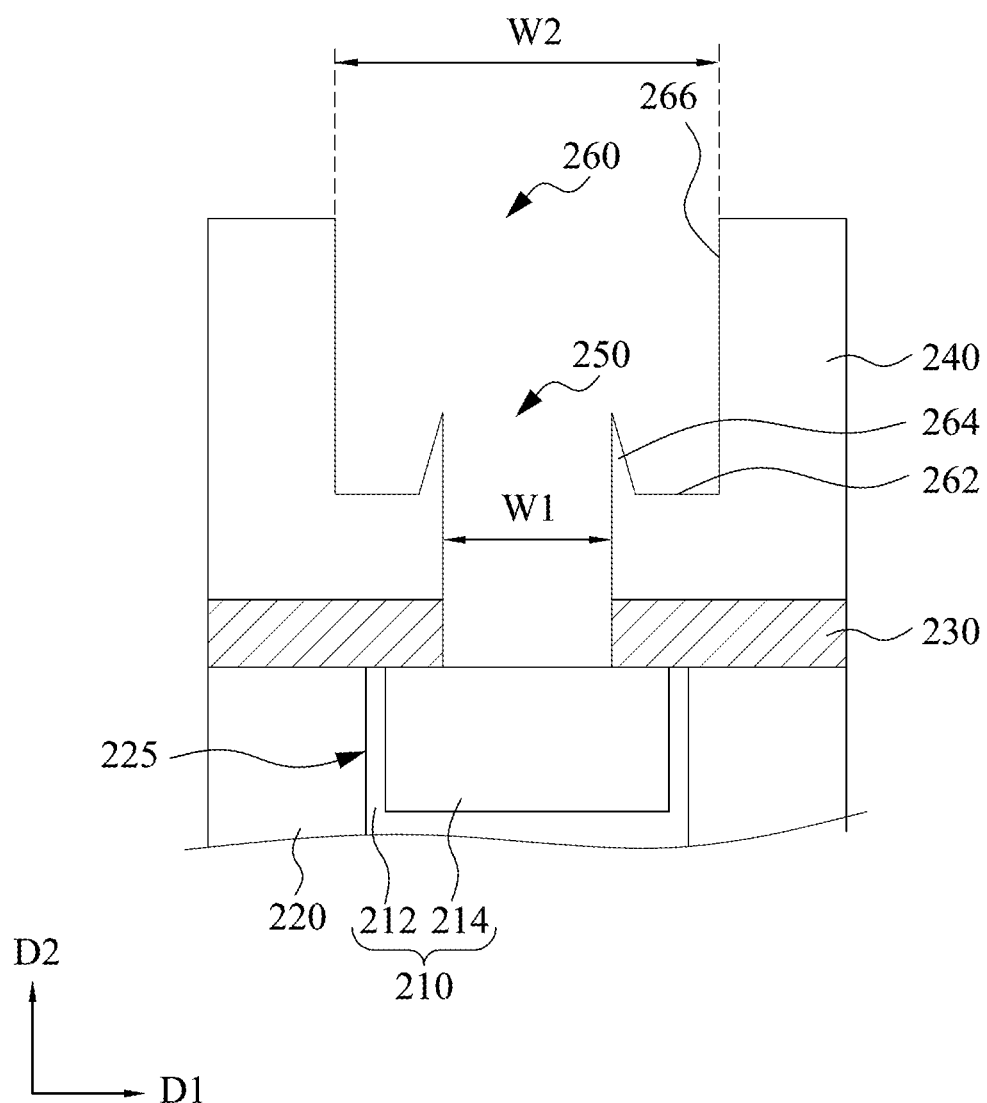

Referring to FIG. 1, in operation 160, a trench 260 is formed on a top of the second oxide layer 240 by the opening 425 of the photo-resist layer 420 through a photolithography process. As shown in FIG. 6, the formed trench 260 is aligned with the through via 250 and has the width W2 along the second direction D2. By the BARC 430 filled in the through via 250, the through via 250 is still extended along the second direction D2. Further, the BARC 430 is also removed, and the through via 250 is extended to the conductive layer 214 of the semiconductor integrated circuit 210 through the etch stop layer 230 by the photolithography process.

As shown in FIG. 6, in this embodiment, the formed trench 260 is recessed from a top of the second oxide layer 240 and includes a bottom 262 and a sidewall 266. The through via 250 is extended from the bottom 262 of the trench 260 to the conductive layer 214. However, since the BARC 430 is configured in the through via 250 during the photolithography process, a fence 264 is left remaining on the bottom 262 of the trench 260. In the cross-sectional view of FIG. 6, the fence 264 is protruded from the bottom 262 and located at an edge of the through via 250. Specifically, the fence 264 is a ring which surrounds the through via 250. The ring-shaped fence 264 needs to be removed to avoid affecting metal depositing in the trench 260 and the through via 250.

To remove the fence 264, which is a portion of the second oxide layer 240, an etchant for removing oxide can be used. However, the through via 250 and the exposed conductive layer 214 may be damaged by the etchant used to remove the oxide fence 264.

Figure 7:
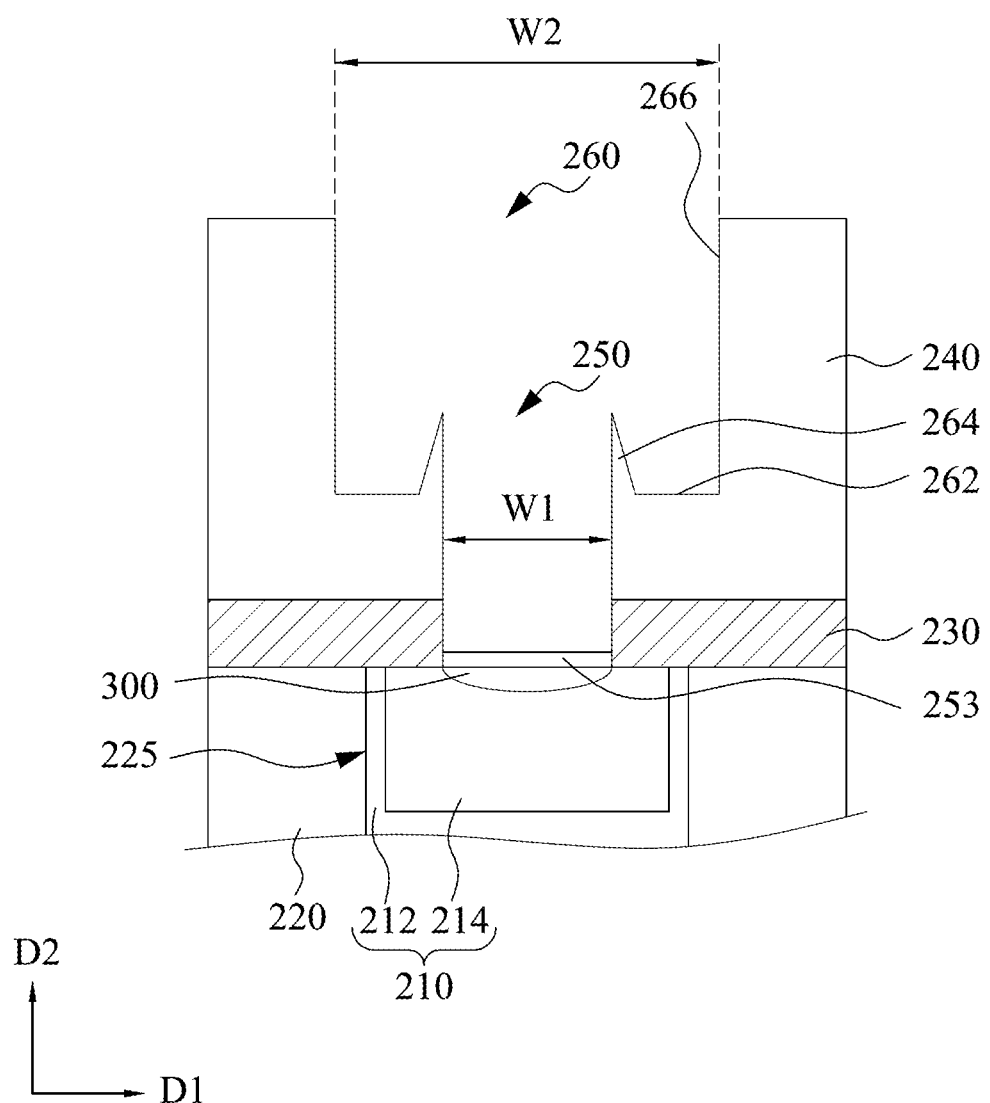

Reference is now made to both FIG. 1 and FIG. 7. In operation 170, a fluid of an acid 253 is provided on the conductive layer 214 exposed by the through via 250. The acid 253 is used to react with a top of the exposed conductive layer 214.

In this embodiment, the fluid of the acid 253 is selected as citric acid (chemical formula: $C_6H_8O_7$) liquid, which has a pH value in a range between two and four. In some embodiments, the citric acid liquid has a pH value in a range between three and four. As mentioned above, in this embodiment, the material of the conductive layer 214 is copper. In such a case, a compound of copper and the citric acid liquid with the pH value in the range between two and four is formed as a protective layer 300 on the top of the exposed conductive layer 214. The protective layer 300 formed by the copper and the citric acid with the pH value in the range between two and four has an ability to resist oxide etching, which can be used to remove the oxide fence 264.

Specifically, in this embodiment, hydrofluoric acid can be used to remove the oxide fence 264. However, hydrofluoric acid can also remove the metal conductive layer 214 exposed by the through via 250. By forming a protective layer 300 on the top of the conductive layer 214 exposed by the through via 250, the conductive layer 214 under the protective layer 300 can be left remaining.

In this embodiment, the protective layer 300 on the conductive layer 214 is formed by the compound of copper and the citric acid with the pH value in the range between two and four. The compound of copper and the citric acid with the pH value in the range between two and four is a complex of copper and citric acid. Compared with the protective layer 300 formed by the complex of copper and citric acid, the hydrofluoric acid can more easily erode the oxide fence 264. Therefore, before all of the protective layer 300 formed by the compound of copper and citric acid on the conductive layer 214 is removed by the hydrofluoric acid, the oxide fence 264 is vanished.

Figure 8:
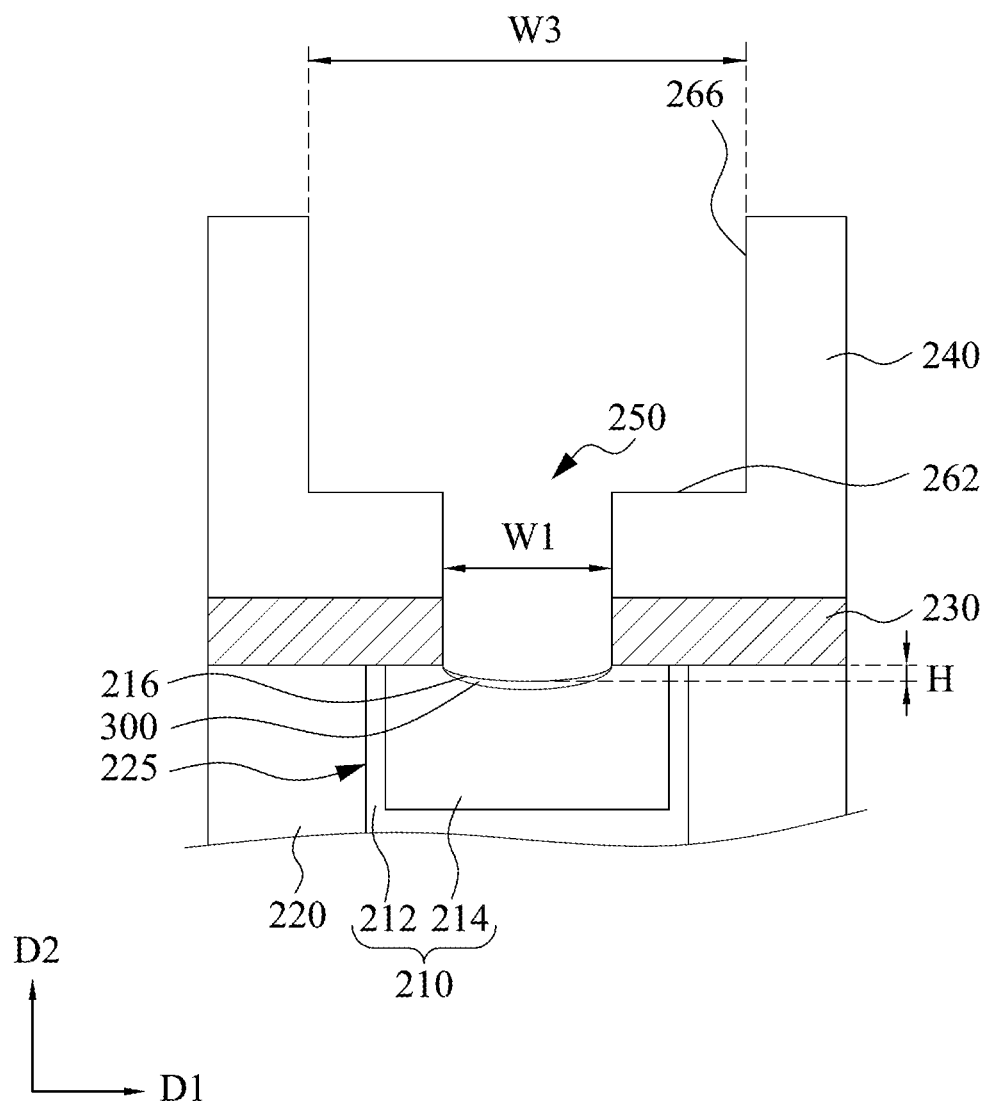

Reference is made to FIG. 1 and FIG. 8. In operation 180, the oxide fence 264 on the bottom 262 of the trench 260 is removed. In this embodiment, the oxide fence 264 is removed by using a hydrofluoric acid etching, and the bottom 262 of the trench 260 is flattened.

In some embodiments, the acid 253 is not citric acid but can still react with the copper to form a complex. In some embodiments, the material of the conductive layer 214 is not copper but can still react with citric acid, which has a pH value in a determined range so that a complex of the material of the conductive layer 214 and the citric acid can still be formed. In some embodiments, the acid 253 can include other acids reacting with the material of the conductive layer 214 to form an organic complex. Compared with the protective layer 300 formed by the organic complex of an acid 253 and the material of the conductive layer 214, the hydrofluoric acid etching can more easily erode the oxide fence 264. In other words, the protective layer 300 has an ability of resist the hydrofluoric acid etching, and the protective layer 300 has a greater resistance against the hydrofluoric acid etching than the fence 264.

Further, referring FIGS. 7 and 8, after the oxide fence 264 on the bottom 262 of the trench 260 is removed, the width W2 of the trench 260 is increased to a width W3 greater than the width W2. Since the hydrofluoric acid has a strong ability to erode oxide, the sidewall 266 of the trench 260 is also removed when the oxide fence 264 is removed.

In some embodiments, other wet etching beyond the hydrofluoric etching can also be used to remove the fence 264, the material of the protective layer 300 is selected to resist the wet etching, and the protective layer 300 is formed by reacting the acid 253 with the material of the conductive layer 214.

The width W3 of the trench 260 is related to the critical dimension (length) of the final structure. To adjust the width W3 of the trench 260 to a desired critical dimension, in operation 150, the width W2 of the opening 425 of the photo-resist layer 420 (as shown in FIG. 5) can be designed to a width less than the desired critical dimension, so that the trench 260 is formed having the width W2 less than the desired critical dimension in operation 160. Next, the method proceeds to operations 170 and 180, in which when the oxide fence 264 is removed, the width W2 of the trench 260 is also increased to the width W3, which is the determined critical dimension.

As shown in FIG. 8, a recess 216 is formed on the top of the conductive layer 214. In some embodiments, the recess 216 includes the protective layer 300 formed by the acid 253 and the material of the conductive layer 214. In some embodiments, since the conductive layer 214 is protected by the protective layer 300 formed by the acid 253 and the material of the conductive layer 214, a depth H from the top of the conductive layer 214 can be reduced. In this embodiment, the depth H from the top of the conductive layer 214 is equal to or less than 18 nm.

Figure 9:
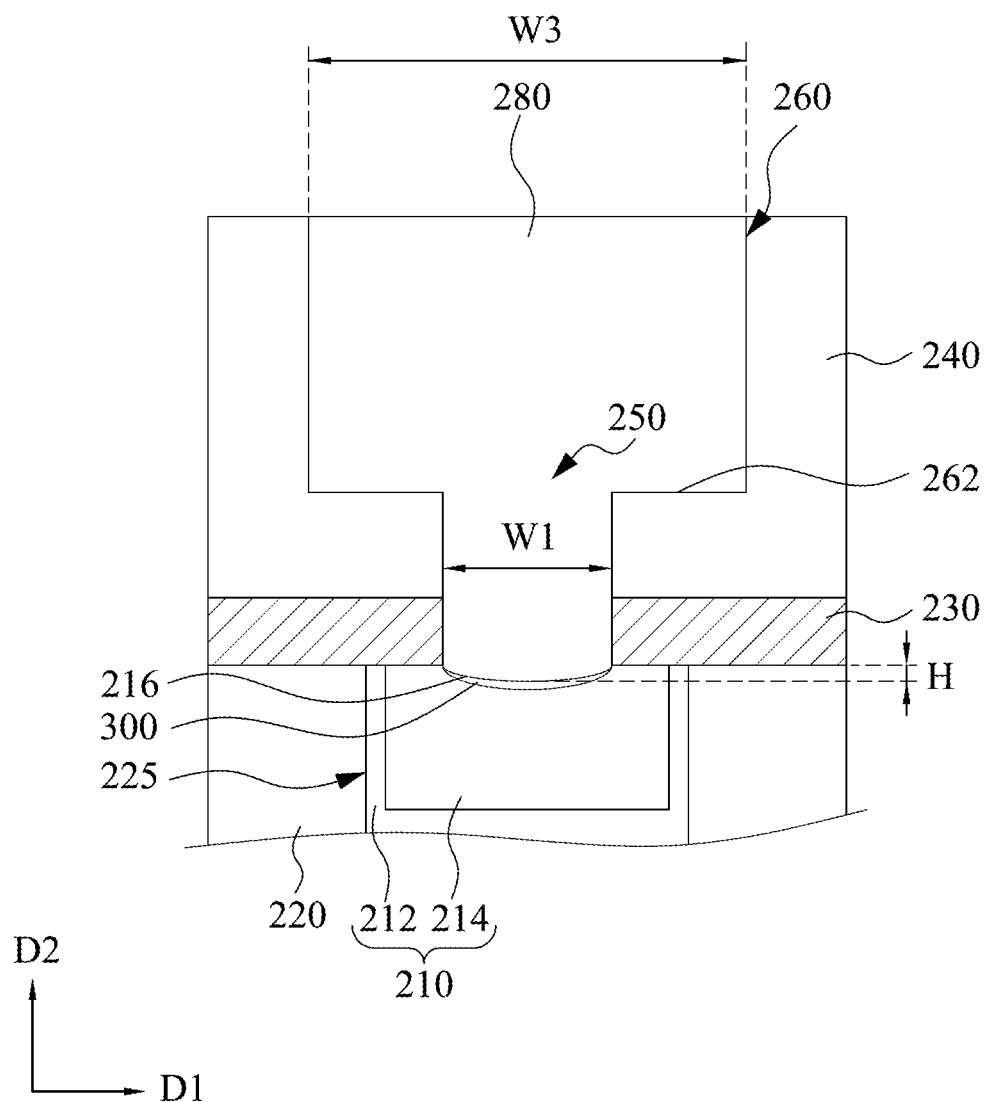

Reference is now made to FIG. 1 and also FIG. 9. In operation 190, a conductive material 280 is filled in the recess 216, the through via 250 and the trench 260, and a semiconductor structure 200 is formed. In this embodiment, the semiconductor structure 200 includes the semiconductor integrated circuit 210, the first oxide layer 220, the etch stop layer 230, the second oxide layer 240, the through via 250, the trench 260 and the conductive material 280.

The first oxide layer 220 exposes the conductive layer 214 of the semiconductor integrated circuit 210. The etch stop layer 230 is formed on the semiconductor integrated circuit 210. The second oxide layer 240 is formed on the etch stop layer 230. The trench 260 is recessed from the top of the second oxide layer 240. The trench 260 has a width W3, which is the determined critical dimension. The through via 250 is extended from the bottom 262 of the trench 260 to the conductive layer 214 through the second oxide layer 240 and the etch stop layer 230. The recess 216 is on the top of the conductive layer 214 and includes a protective layer 300 formed by the acid and the material of the conductive layer 214.

In this embodiment, the protective layer 300 can be a compound formed by copper, which is the material of the conductive layer 214, and citric acid with pH value in the range between 2 to 4. In some embodiments, the depth H of the recess 216 from the top of the conductive layer 214 is equal to or less than 18 nm.

In summary, the formed semiconductor structure has a protective layer, which includes a compound of the acid and metal and has the ability to resist hydrofluoric acid etching. Further, after etching, the fence affecting the overall electrical properties can be removed, and a conductive layer of the semiconductor integrated circuit can be left remaining. The formation of an undesired recess from the top of the conductive layer of the semiconductor integrated circuit can be reduced.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A method of manufacturing a semiconductor structure, comprising:
    providing a first oxide layer on a semiconductor integrated circuit, wherein a conductive layer of the semiconductor integrated circuit is exposed from a top surface of the first oxide layer;
    forming an etch stop layer on the top surface of the first oxide layer;
    forming a second oxide layer on the etch stop layer;
    forming a through via extending through the second oxide layer and the etch stop layer to expose the conductive layer and form a fence that is a portion of the second oxide layer and protrudes from an edge of the through via;
    providing a fluid of an acid that is spaced apart from the second oxide layer on the conductive layer exposed from the through via in the etch stop layer to form a protective layer on a top surface of the conductive layer, wherein the protective layer comprises a compound of the acid and a material of the conductive layer; and
    removing the fence by a wet etching, wherein the protective layer has a greater resistance against the wet etching than the fence.

2. The method of claim 1, wherein the acid is citric acid.

3. The method of claim 2, wherein the fluid of the citric acid has a pH value in a range between two and four.

4. The method of claim 1, wherein the material of the conductive layer is copper.

5. The method of claim 1, wherein the wet etching is a hydrofluoric acid etching.

6. The method of claim 5, further comprising:
    forming a trench recessed from a top of the second oxide layer, wherein the trench is aligned with the through via, a width of the trench is greater than a width of the through via, and the fence is located at a bottom of the trench and surrounds the through via to form a ring.

7. The method of claim 6, wherein the width of the trench is increased to a determined critical dimension after the fence is removed by the hydrofluoric acid etching.

8. The method of claim 6, wherein forming the trench from the top of the second oxide layer further comprises:
    forming a photo-resist layer on the top of the second oxide layer, wherein the photo-resist layer has an opening corresponding to the width of the trench;
    filling an anti-reflective coating in the through via; and
    etching the second oxide layer according to the opening of the photo-resist layer to form the trench.

9. The method of claim 8, wherein the anti-reflective coating filled in the through via is located on the etch stop layer, and the forming the through via extending through the second oxide layer and the etch stop layer to expose the conductive layer further comprises:
    removing the anti-reflective coating filled in the through via; and
    extending the through via within the second oxide layer through the etch stop layer to the conductive layer.

10. The method of claim 1, further comprising:
    filling a conductive material in the through via.

* * * * *